United States Patent [19]

Grossa et al.

[11] 4,203,770
[45] May 20, 1980

[54] NEGATIVE TONABLE PHOTOHARDENABLE ELEMENT

[75] Inventors: Mario Grossa, Dreieich; Helmut G. Sandner, Nieder-Roden, both of Fed. Rep. of Germany

[73] Assignee: E. I. Du Pont de Nemours and Company, Wilmington, Del.

[21] Appl. No.: 926,577

[22] Filed: Jul. 20, 1978

[30] Foreign Application Priority Data

Jul. 26, 1977 [DE] Fed. Rep. of Germany ....... 2733581

[51] Int. Cl.² .......................... G03C 1/78; G03C 1/96
[52] U.S. Cl. .................................... 430/270; 430/252; 430/322; 430/281; 430/495
[58] Field of Search ................... 96/28, 115 P, 115 R, 96/87 R, 67, 35.1

[56] References Cited

U.S. PATENT DOCUMENTS

| | | | |
|---|---|---|---|
| 3,060,024 | 10/1962 | Burg et al. | 96/27 R |
| 3,582,327 | 6/1971 | Boyd et al. | 96/28 |
| 3,649,268 | 3/1972 | Citu et al. | 96/27 R |
| 3,785,817 | 1/1974 | Kuchta | 96/28 |
| 3,970,453 | 7/1976 | Beli et al. | 96/28 |

Primary Examiner—Jack P. Brammer

[57] ABSTRACT

Photohardenable element for the production of negative tonable images comprising (1) support, (2) intermediate layer containing at least one thermoplastic binder, (3) photohardenable layer containing addition polymerizable monomeric compound or photocrosslinkable compound, (4) tonable layer comprising a polymeric binder and a non-volatile diffusible component, e.g., a plasticizer for the binder and (5) optionally removable cover sheet, and process of use. The element is used for image reproduction, e.g., colored prints.

8 Claims, No Drawings

NEGATIVE TONABLE PHOTOHARDENABLE ELEMENT

DESCRIPTION

Technical Field

This invention relates to photohardenable elements and particularly photohardenable elements for the production of negative tonable images. The invention also relates to a process for the preparation of the photohardenable negative tonable images.

BACKGROUND ART

Photohardenable elements are now well known as reproduction means in many areas of photographic reproduction. The differences in the properties of the imagewise exposed and unexposed areas of the photohardenable layer are used to produce the image, e.g., differences in solubility, differences in the softening point, tackiness, adhesive properties, etc.

Reproduction processes are known from U.S. Pat. Nos. 3,060,024, 3,582,327 and 3,649,268 wherein photopolymerizable elements comprising a base support bearing a photopolymerizable layer comprising at least one addition polymerizable monomeric compound, a photopolymerization initiator and a polymer binder are exposed imagewise through an original forming tacky and nontacky image areas. The image is made visible (developed) by dusting with a suitable toner which adheres only to the unexposed tacky areas. Excess toner is then removed from the exposed, nontacky image areas. By the aforementioned process, positive colored images of the original are obtained which are equivalent to press proofs. While positive images are achieved by the above process, it has not been possible to prepare negative images with respect to the original. Such a need for reproduction of negative images exists in many applications, e.g., direct color separation technology.

DISCLOSURE OF THE INVENTION

In accordance with the invention a photohardenable element for the preparation of negative tonable images is provided that comprises (1) a support;
(2) an intermediate layer consisting essentially of at least one thermoplastic polymeric binder;
(3) a photohardenable layer comprising an addition polymerizable ethylenically unsaturated compound or a compound having photocrosslinkable groups, and a polymeric binder; and optionally,
(5) a removable cover sheet, the improvement wherein over layer (3) is a layer
(4) which is tonable and which comprises a polymeric binder and a nonvolatile diffusible component which can diffuse imagewise from the tonable layer thereby, removing tonability in the areas of the tonable layer from which diffusion occurs.

In accordance with another embodiment of this invention there is provided a process for the preparation of toned negative images with respect to an original image formed in a photohardenable element of the configuration described above by imagewise exposure through the original, the process comprising the diffusion of the nonvolatile component from the tonable layer (4) modulated by the imagewise exposed photohardenable layer (3), and producing the negative image in the tonable layer by the application of finely dispersed solid particles.

In preparing a photohardenable element of the invention, the tonable layer provided above the photohardenable layer and the intermediate layer present for acceptance of tonability producing diffusible components can be applied to the photohardenable layer directly before or after the imagewise exposure, e.g., by lamination and/or relamination. As indicated above, exposure of such element through an original results in a tonable negative being obtained in the tonable layer with respect to the original. The formation of the tonable negative can be accomplished more speedily by heating as described below.

The tonable layer, modulated according to the invention through the photosensitive layer, comprises an organic polymeric binder and a nonvolatile diffusible compound causing tonability of the layer. The term "nonvolatile" means the loss of weight by being heated in atmospheric air at a temperature of $125°$ C.$\pm 3°$ C. for a period of 3 hours, is not greater than 2.0%. Any nonvolatile diffusible compound which is able to diffuse imagewise from the tonable layer is useful. Particularly useful are those compounds which plasticize the binder of the tonable layer and the intermediate layer. Addition polymerizable monomer compounds have proven to be especially suitable for this purpose. Many suitable monomers are known, e.g., from U.S. Pat. No. 3,060,024. Specific compounds are: ethylene diacrylate, diethylene glycol diacrylate, glycerin diacrylate, glycerin triacrylate, ethylene dimethacrylate, 1,3-propanediol dimethacrylate, 1,2,4-butanetriol trimethylacrylate, 1,4-cyclohexanediol diacrylate, 1,4-hydroquinone dimethacrylate, pentaerythritol tetramethacrylate, trimethylol propane triacrylate, 1,3-propanediol diacrylate, 1,5-pentanediol dimethacrylate, or the bis-acrylates and bismethacrylates of polyethylene glycols with a molecular weight of 200–500.

High-boiling solvents with a boiling point of at least $150°$ C. are also suitable as nonvolative diffusible compounds causing tonability. Such compounds include esters of higher fatty acids, e.g., butyric, hexanoic, octanoic, pelargonic, etc., acids with higher multivalent alcohols, e.g., diethylene glycol, triethylene glycol, glycerol, etc. and their derivatives. Polyethylene oxide compounds and their alkylation products with a molecular weight up to 1,500 have also proven to be usable.

Many different thermoplastic binders are suitable for the preparation of the tonable layer, e.g., as described in U.S. Pat. No. 3,060,024. Preferred compounds are polyvinyl esters, e.g., pure polyvinyl acetate; mixed polymers of vinyl acetate, and an acrylic acid ester, especially acrylic acid methyl ester, polyacrylic acid ester; and α-alkyl polyacrylic acid ester, e.g., polyacrylic acid methyl ester, polyacrylic acid ethyl ester, polymethacrylic acid methyl ester, or polymethacrylic acid ethyl ester. High molecular polyethylene oxides or polyglycols with a molecular weight from 4,000 to 1 million are also useful.

The binder of the tonable layer should not have a greater affinity to the compound producing the tonability than the binder of the photohardenable layer and the intermediate layer. In an especially preferred embodiment, the tonable layer and the photosensitive layer will contain an identical binder. If the tonable layer is applied during the preparation of the element (prior to exposure), then preferably a binder whose glass transition temperature does not substantially fall below +10° C. is selected for the tonable layer.

The selection of suitable binder combinations is possible based on general knowledge and is of no difficulty to those skilled in the art. Homo- and copolymers of acrylic and methacrylic acid and their esters and copolymers of vinyl acetate and methyl methacrylate have proven to be especially effective as binders for the photohardenable layer, while poly(methylmethacrylate) and copolymers of acrylic acid and its esters have proven to be effective as binders for the tonable layer.

The concentration of nonvolatile diffusible compounds producing the tonability generally is 0.5 to 20% by weight in reference to the thermoplastic binder of the tonable layer.

All known photohardenable layers are believed to be suitable as photosensitive layers. Of special significance, thereby, are known photopolymerizable layers, which contain as essential ingredients an addition polymerizable monomeric ethylenically unsaturated compound, an organic polymeric binder, and an addition polymerization initiator. Such layers, e.g., are described in U.S. Pat. Nos. 3,060,024 and 3,649,268.

In addition, known photocrosslinkable layers are suited for the photohardenable layer. These layers contain polymeric compounds, which comprise light-sensitive groups, which result in a crosslinking of the polymer chain upon exposure. Especially suitable are polymers which contain cinnamic acid grouping, carbonyl azide, or sulfonyl axide groupings in the side chains. Such systems are described in Chapter 4 of the book "Light-Sensitive Systems" by Jaromir Kosar, John Wiley and Sons, New York, 1965.

The thickness of the photohardenable layer can vary according to the composition. The photohardenable mixtures, however, are preferably applied as thin layers, e.g., between 4 and 14μ in thickness.

The intermediate layer between the light-sensitive layer and the support must be able to absorb the diffusible compounds causing tonability and preferably contains at least one thermoplastic polymer, such as are described in U.S. Pat. No. 3,060,024.

The binder in the intermediate layer should always be selected so that its affinity for diffusible compounds producing tonability is greater than its affinity for the binder of the tonable layer. In another embodiment of the element, the support used can also be coated with a thermoplastic polymer or can itself absorb the diffusing tonability-conferring components so that a special intermediate layer becomes unnecessary.

The support can be metal, e.g., steel or aluminum, glass, wood, paper, cloth, cellulose ester, e.g., cellulose acetate, cellulose propionate, or cellulose butyrate, polyvinyl chloride, polyvinyl acetate, polystyrene, polyisobutylene, polyacrylonitrile, mixed polymers of vinyl chloride and a random monomer of the last named polymers, polyester, e.g., polyethylene terephthalate, polyamide, e.g., polyhexamethylene sebacamide, or polyester amides, e.g., polyhexamethylene adipamide/adipate. The support can contain fillers, such as synthetic, modified or natural fibers, e.g., of cellulose, cotton, cellulose acetate, viscous rayon, paper, glass wool, or polyamide. A film support is preferred.

To prepare the image, the element is exposed through the cover sheet using conventional UV light sources under an original. The exposure time is determined by the sensitivity of the photohardenable layer used. Generally, exposure times of 2 to 50 seconds will suffice. After a pause of 2 seconds to 10 minutes the cover sheet is removed and the negative sticky image is made visible by dusting with a suitable toner, which will adhere only to the sticky areas of the image.

If an element is used, in which the diffusibility of the high-boiling components is practically frozen or negligible at room temperature, then diffusion can be accomplished by heat treatment, e.g., of the support side of the material. The preparation of the image can be accelerated by a heat treatment, and the image is produced almost immediately. Generally, it will suffice to heat the material from the support side for 10 seconds to 2 minutes to 40° to 80° C., e.g., using a conventional photodrying press. According to an especially preferred embodiment, the production of the image can also take place in a way, that a conventional photopolymerizable or photocrosslinkable element is first exposed imagewise and then the photosensitive tonable layer of the invention, which consists of a thermoplastic binder and a diffusible compound producing tonability, is applied onto the exposed layer. The application of this layer can take place in known manner, e.g., by cold lamination and the like.

According to another variation, the photosensitive layer can also be first laminated onto the photohardenable element, which the laminate is given an imagewise exposure.

If the photohardenable layer is on a film base where the intermediate layer serving for the absorption of the nonvolatile compound is not present, then this layer can likewise be applied by lamination and/or relamination before or after the imagewise exposure.

Suitable toners for the development of the latent image consist of finely dispersed solid materials, such as pigments, powders, or dyes. Pigments dispersed in a cellulose acetate substance have proven to be especially suitable. Toners disclosed in U.S. Pat. Nos. 3,620,726 and 3,909,282 are useful.

In all instances, following toning, negatives with respect to the original are obtained. These have a matte appearance resembling printing ink and are well suited for the preparation of colored prints.

EXAMPLES

The following examples illustrate the invention.

EXAMPLE 1

Unto a polyester film base, which is provided with an intermediate layer of a mixed polymer of methyl methacrylate ethyl acrylate/acrylic acid (Carboset® 525/Goodrich Chemical Corporation) is applied a photopolymerizable composition as follows:

10.0 g polymethyl methacrylate
1.0 g polyvinyl acetate
2.0 g trimethylol propane trimethacrylate
0.005 g phenanthraquinone
0.003 g p-methoxyphenol
150.0 g methylene chloride to provide a dry layer thickness of 7μ. Onto this layer, a solution of the following composition is applied:

10.0 g polyacrylic acid methyl ester
7.0 g triethylene glycol dimethacrylate
180.0 g methylene chloride to provide a dry layer thickness of 5μ and a transparent cover sheet is applied thereon.

The element is exposed through the cover sheet for 10 seconds under an original at a distance off 80 cm using a mercury vapor layer (1,000 W). The cover sheet is removed after heating the element for 2 minutes at 80° C. and the layer is dusted with a colored toner. After removal of the excess toner, a colored negative image of the original is obtained.

EXAMPLE 2

The following photopolymerizable composition is applied onto a polyester film base, which is coated with an intermediate layer of polyvinylidene chloride:

10.0 g polymethacrylic acid methyl ester
2.0 g trimethylol propane triacrylate
0.5 g of a mixture of benzophenone and Michler's ketone (ratio 20:1)
150.0 g methylene chloride to provide a dry layer thickness is $7\mu$. Onto this layer a solution of the following composition is applied:

10.0 g polymethacrylic acid methyl ester
9.0 g triethylene glycol diacetate
160.0 g methylene chloride to provide a dry layer thickness of $6\mu$ and a transparent cover sheet is applied thereon. The element is then exposed through the covering film for 5 seconds under an original at a distance of 80 cm using a mercury vapor lamp (1,000 W). The element is then heated on the support side 2 minutes at 50° C. on a drying press and, after removal of the cover sheet, is dusted with a colored toner. A colored negative image of the original is obtained.

EXAMPLE 3

A dry photopolymerizable layer, prepared by casting from 150 ml methylene chloride onto a polyester film base the following composition:

16.0 g polymethyl methacrylate
1.2 g 1,3,5-trimethyl barbituric acid
28.0 g trimethylol propane trimethacrylate
0.3 g 2,2'-bis-(o-chlorophenyl)-4,4,5,5'-tetrakis-(m-methoxyphenyl))-biimidazole
3.5 g tricresyl phosphate is laminated onto a paper coated with polyvinylidene chloride, is exposed imagewise under an original as described in Example 1 and, if present, the cover sheet is removed. Onto the exposed photopolymerizable layer is cold laminated a tonable layer which is cast onto a silicon coated polyester film base and contains the following ingredients:

16.0 g polymethyl methacrylate
1.2 g 1,3,5-trimethyl barbituric acid
28.0 g trimethylol propane trimethacrylate.

The dry thickness of the tonable layer is $6\mu$. The element is then heated on the support side for 2 minutes at 50° C. on a drying press, and the silicon coated film is removed. After toning, a colored negative image of the original is obtained.

EXAMPLE 4

Onto the photopolymerizable element described in Example 3 is cold laminated, after the removal of the cover sheet, a tonable layer, $8\mu$ thick, of the following composition applied onto a silicon coated polyester film:

5.0 g copolymer of methyl methacrylate/ethyl acrylate/acrylic acid (Carboset ® 525 Goodrich Chemical Corporation)
5.0 g of a copolymer of styrene and maleic acid semi-ester (SMA ® 17 352 Arco Chemical Company)
10.0 g trimethylol propane triacrylate.

The element is then exposed under an original according to the procedure described in Example 1, is heated from the support side for 1 minute at 60° C. on a drying press and the silicon coated film is removed. After toning, a colored negative of the original is obtained.

EXAMPLE 5

Onto the photopolymerizable element described in Example 2 is cold laminated, after the removal of the cover sheet, a tonable layer, $8\mu$ thick, of the following composition applied onto a silicon coated polyester film:

12.0 g polyacrylic acid ethyl ester
12.0 g polyglycol hexadecyl ether

The element is exposed behind a frame according to the procedure described in Example 1, is heated from the support side for 1 minute at 60° C. on a drying press and the silicon coated film is removed. After toning, a colored negative of the original is obtained.

EXAMPLE 6

The photopolymerizable element described in Example 3 is laminated onto a paper coated with polyvinyl chloride and is exposed according to the procedure described in Example 1 under an original and, if necessary, the cover sheet is removed. Onto the exposed layer is cold laminated a tonable layer, $7\mu$ thick, which had been cast onto a silicon coated polyester film. The tonable layer is of the following composition:

30.0 g polymethacrylic acid methyl ester
20.0 g polyethylene oxide compound with a molecular weight of 600.

The element then is heated from the support side for 2 minutes at 40° C. on a drying press and the silicon coated film is removed. After toning, a colored negative of the original is obtained.

EXAMPLE 7

The photopolymerizable material described in Example 3 is laminated onto a paper coated with polyvinyl chloride and is exposed according to the procedure described in Example 1 under an original and, if necessary, the cover sheet is removed. Onto the exposed layer is cold laminated a tonable layer, $7\mu$ thick, which had been cast onto a silicon coated polyester film. The tonable layer is of the following composition:

29.0 g polymethacrylic acid-n-butyl ester
19.0 g of a mixture of triethylene glycol-di-n-hexanoic acid triethylene glycol-di-n-octanoic acid (Plasticizer SC ® of the Drew Chemical Corp., New York).

The element is then heated from the support side for 2 minutes at 40° C. on a drying press and the silicon coated film is removed. After toning, a colored negative of the original is obtained.

We claim:

1. A photohardenable element for the preparation of negative tonable images comprising
   (1) a support;
   (2) an intermediate layer consisting essentially of one or more thermoplastic polymeric binders;
   (3) a photohardenable layer comprising an addition polymerizable ethylenically unsaturated compound or a compound having photocrosslinkable groups, and a polymeric binder; and optionally,
   (5) a removable cover sheet, the improvement wherein over layer (3) is a layer (4) which is tonable and which comprises a polymeric binder and a nonvolatile diffusible component which can diffuse imagewise from the tonable layer thereby removing tonability in the areas of the tonable layer from which diffusion occurs.

2. A photohardenable element according to claim 1 wherein tonable layer (4) comprises a polymeric binder and a nonvolatible diffusible component which is a plasticizer for the binder.

3. A photohardenable element according to claim 1 or claim 2 wherein the diffusibility of the nonvolatile component is negligible at room temperature but the nonvolatile component is diffusible at temperatures above about 40° C.

4. A photohardenable element according to claim 3 wherein the polymeric binder in tonable layer (4) has a glass transition temperature not less than about 10° C.

5. A photohardenable element according to claim 1 wherein the nonvolatile diffusible component is an addition polymerizable monomeric compound and/or a nonvolatile solvent having a boiling point of at least 150° C.

6. A photohardenable element according to claim 1 wherein photohardenable layer (3) and tonable layer (4) contain identical addition polymerizable ethylenically unsaturated compounds and polymeric binders.

7. A photohardenable element according to claim 1 wherein the nonvolatile diffusible component of tonable layer (4) is trimethylol propane triacrylate.

8. A photohardenable element according to claim 1 wherein the nonvolatile diffusible component of tonable layer (4) is taken from the group consisting of esters of higher fatty acids and polyethylene oxide compounds or their alkylation derivatives drawing a molecular weight up to 1,500.

* * * * *